United States Patent
Aksin et al.

(10) Patent No.: US 10,845,839 B1
(45) Date of Patent: Nov. 24, 2020

(54) CURRENT MIRROR ARRANGEMENTS WITH DOUBLE-BASE CURRENT CIRCULATORS

(71) Applicant: Analog Devices, Inc., Norwood, MA (US)

(72) Inventors: Devrim Aksin, Stokesdale, NC (US); Omid Foroudi, Greensboro, NC (US)

(73) Assignee: ANALOG DEVICES, INC., Norwood, MA (US)

(*) Notice: Subject to any disclaimer, the term of this patent is extended or adjusted under 35 U.S.C. 154(b) by 0 days.

(21) Appl. No.: 16/570,346

(22) Filed: Sep. 13, 2019

(51) Int. Cl.
| | |
|---|---|
| *H03M 1/12* | (2006.01) |
| *G05F 3/26* | (2006.01) |
| *G05F 3/18* | (2006.01) |
| *H03M 1/06* | (2006.01) |

(52) U.S. Cl.
CPC .............. *G05F 3/265* (2013.01); *G05F 3/262* (2013.01); *H03M 1/12* (2013.01); *G05F 3/185* (2013.01); *G05F 3/26* (2013.01); *H03M 1/06* (2013.01)

(58) Field of Classification Search
CPC .. H03M 1/12; H03M 1/06; G05F 3/26; G05F 3/185
USPC ......... 341/155, 118; 323/315, 312, 316, 311
See application file for complete search history.

(56) References Cited

U.S. PATENT DOCUMENTS

| | | | |
|---|---|---|---|
| 4,550,284 A | 10/1985 | Sooch | |
| 4,583,037 A | 4/1986 | Sooch | |
| 5,808,508 A | 9/1998 | Castellucci et al. | |
| 5,945,873 A | 8/1999 | Antone et al. | |
| 7,636,016 B2 * | 12/2009 | Russell | G05F 3/265 |
| | | | 323/315 |
| 8,575,971 B1 | 11/2013 | Chamakura | |
| 2006/0013982 A1 | 1/2006 | Malik et al. | |
| 2006/0017598 A1 | 1/2006 | Hales et al. | |
| 2007/0052402 A1 | 3/2007 | Sirito-Oliver et al. | |
| 2012/0001613 A1 | 1/2012 | Larsen et al. | |
| 2014/0167859 A1 | 6/2014 | Bettencourt et al. | |

* cited by examiner

*Primary Examiner* — Joseph J Lauture
(74) *Attorney, Agent, or Firm* — Patent Capital Group

(57) ABSTRACT

A current mirror arrangement with a current mirror and a double-base current circulator is disclosed. The current mirror is configured to receive an input current ($I_{IN}$) and generate a mirrored current (IM), where IM=K*$I_{IN}$. The current circulator, coupled to the current mirror, is configured to convey the mirrored current to an output node of the arrangement. The current circulator is a double-base current circulator and includes a first branch configured to receive a first branch current (I1b), where I1b=m*IM, where m is a positive number less than 1, and further includes a second branch configured to receive a second branch current (I2b), where I2b=(1−m)*IM. The first branch includes a cascode of transistors Q3 and Q5, configured to provide I1b to an output node. The second branch includes a transistor Q4 configured to provide I2b to the output node, where it is combined with I1b.

26 Claims, 7 Drawing Sheets

CURRENT MIRROR ARRANGEMENTS WITH DOUBLE-BASE CURRENT CIRCULATORS

TECHNICAL FIELD OF THE DISCLOSURE

The present disclosure relates generally to electronic devices and, more particularly, to current mirror circuits.

BACKGROUND

Current mirrors are one of the few building blocks that are fundamental to the general circuit designs. In particular, broadband linear current mirrors are one of the major founding blocks of open loop broadband linear amplifiers utilized within wide range of markets, such as communication, military, automotive, industrial.

Designing current mirrors that can mirror their input current with a constant amplification factor to their outputs within a wide operating bandwidth in a linear fashion and in presence of the ever increasing fundamental input signal frequency is not trivial. At a given operating frequency, linearity and signal bandwidth of a current mirror ultimately set an upper bound to the dynamic range of an amplifier, or any other circuit in which the current mirror is used. Classically, linearity is traded off with bandwidth and power. Consequently, having current mirrors that have both high linearity and wide signal bandwidth would provide a significant competitive advantage in differentiating products in a respective market.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
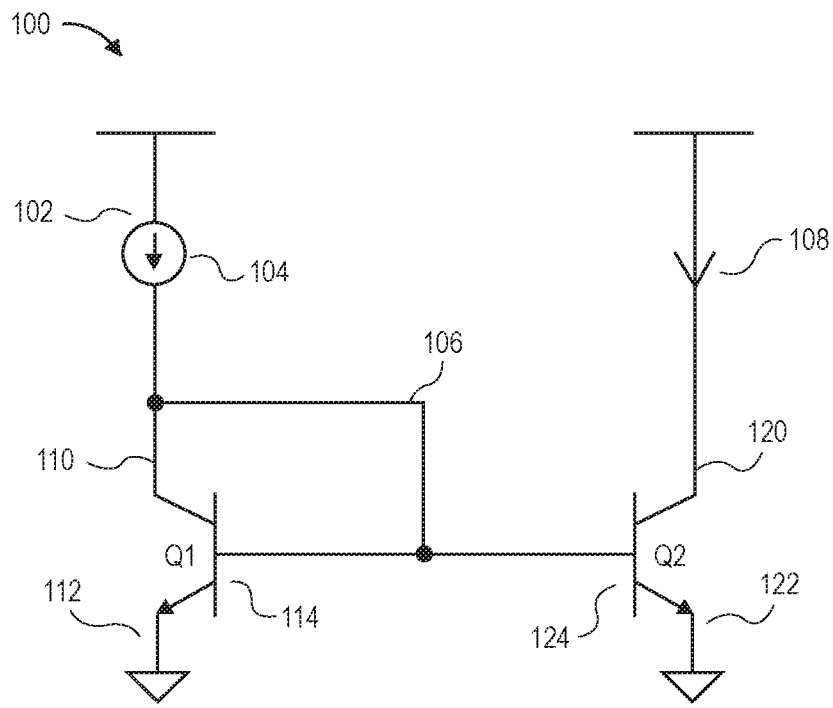
FIG. 1 provides an electric circuit diagram of an NPN implementation of a current mirror with a current gain of N.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

In one aspect, a current mirror arrangement with a double-base current circulator is disclosed. The arrangement includes a current mirror and a current circulator. The current mirror is configured to receive an input current ($I_{IN}$) and generate a mirrored current (IM), where IM=K*$I_{IN}$, where K is a positive number greater than 0 (which value may, but does not have to be, an integer). The current circulator is coupled to the current mirror and is configured to provide the mirrored current to an output node of the arrangement. The current circulator is a double-base current circulator and includes a first branch configured to receive a first branch current (I1b), where I1b=m*IM, where m is a positive number greater than 0 and less than 1, and further includes a second branch configured to receive a second branch current (I2b), where I2b=(1−m)*IM. The first branch includes a cascode of a transistor Q3 and a transistor Q5 configured to provide the I1b to an output node. The second branch includes a transistor Q4 (an optionally may also include a transistor Q6), configured to provide the I2b to the output node. Because both the first branch and the second branch are coupled to the output node, the respective currents in these two branches may be combined at the output node to an output current that is a sum of Ib1 and Ib2 (which is equal to IM), thus conveying the mirrored input current $I_{IN}$, which may be multiplied by a factor of K, to the output node. In the embodiments where K is greater than 0 but less than 1, multiplying by a factor of K means attenuating the current. In the embodiments where K is greater than 1, multiplying by a factor of K means increasing, or gaining, the current. Because one end of each of the first branch and the second branch is coupled to the first circuit and the other end of each of the first branch and the second branch is coupled to the output node, the two branch currents are in electrical parallel to one another.

As will be appreciated by one skilled in the art, aspects of the present disclosure, in particular aspects of a current mirror arrangement with a double-base current circulator, as described herein, may be embodied in various manners—e.g., as a method or as a system. The following detailed description presents various descriptions of specific certain embodiments. However, the innovations described herein can be embodied in a multitude of different ways, for example, as defined and covered by the claims or select examples. For example, while some of the descriptions are provided herein with respect to either bipolar or CMOS transistors, further embodiments of the current mirror arrangements described herein may include any combinations of bipolar and CMOS transistors. In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Various aspects of the illustrative embodiments are described using terms commonly employed by those skilled in the art to convey the substance of their work to others skilled in the art. The terms "substantially," "approximately," "about," etc., may be used to generally refer to being within +/−20% of a target value based on the context of a particular value as described herein or as known in the art. For the purposes of the present disclosure, the phrase "A and/or B" or notation "A/B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A, B, and/or C).

Basics of Current Mirrors

For purposes of illustrating a current mirror arrangement with a double-base current circulator, proposed herein, it might be useful to first understand phenomena that may come into play when current is mirrored. The following foundational information may be viewed as a basis from which the present disclosure may be properly explained. Such information is offered for purposes of explanation only and, accordingly, should not be construed in any way to limit the broad scope of the present disclosure and its potential applications.

FIG. 1 provides an electric circuit diagram of a simple NPN bipolar transistor implementation of a current mirror 100 with a current gain of N, as known in the art. Under the assumption that the transistor current gain β is large enough, the current mirror 100 operates as follows. As shown in FIG. 1, the current mirror 100 may include a first transistor Q1 (which may be referred to as an "input transistor") and a second transistor Q2 (which may be referred to as an "output transistor"). An input current 102 ($I_{IN}$) (i.e., the current to be mirrored at the output of the current mirror 100 to generate an output current 108) may be provided by an input current source 104. The current mirror 100 may first generate a control voltage (voltage VN1) at a node 106 (node N1) by placing the transistor Q1 in feedback to force the current at a collector terminal 110 (or, simply, "collector" 110) of the transistor Q1 to be equal to the input current 102. An emitter terminal 112 (or, simply, "emitter" 112) of the transistor Q1 may be connected to ground, as shown in FIG. 1. A base terminal 114 (or, simply, "base" 114) of the transistor Q1 may be coupled to a base 124 of the transistor Q2. The base 124 of the output transistor Q2 may be driven with the voltage VN1 carrying the input current information to generate the output current 108. FIG. 1 also indicates a collector 120 of the transistor Q2 and an emitter 122 of the transistor Q2, where the emitter 122 may be coupled to ground and where the output current 108 is the current at the collector 120, as shown in FIG. 1. When the emitter area of the transistor Q2 is N times larger than that of the transistor Q1, the output current 108 ($I_O$) may be equal to $N \cdot I_{IN}$.

The simplified model of a bipolar transistor collector current is given by $$I_C = AI_S \exp\left(\frac{V_{BE}}{V_t}\right)$$

where $I_C$, A, $I_S$, $V_{BE}$ and $V_t$ are collector current, emitter area, unit area saturation current, the base-emitter voltage and thermal voltage, respectively. Although the relation between collector current ($I_C$) to base-emitter voltage ($V_{BE}$), or, equivalently input current $I_{IN}$ and VN1, is strongly nonlinear, the input-output current mirroring relation is linear, i.e. $I_O = N \cdot I_{IN}$.

Figure 2:
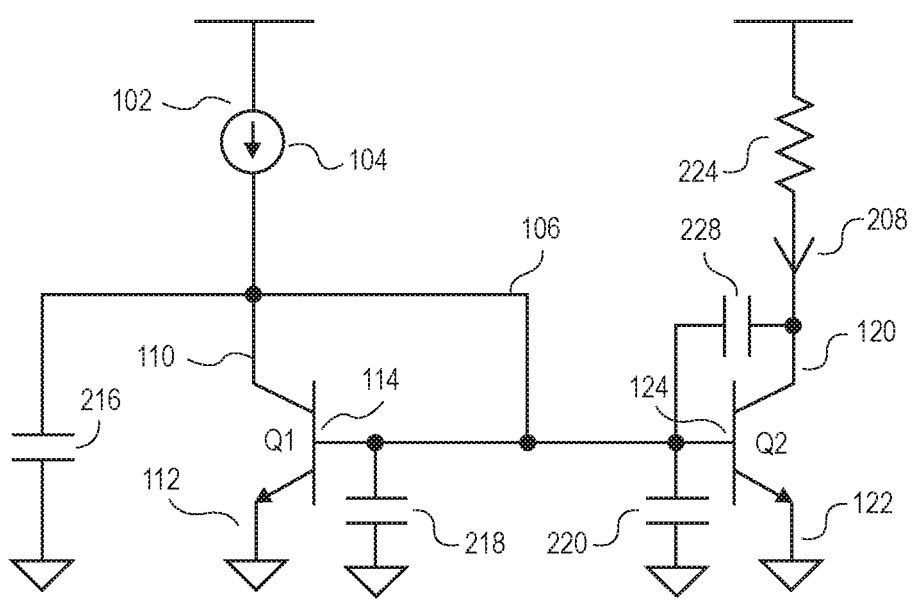
FIG. 2 provides an electric circuit diagram of an NPN implementation of a current mirror of FIG. 1, additionally illustrating relevant parasitic components for high operating frequencies.

The basic analysis given above has many shortcomings in understanding the performance degradation of the current mirror at high operating frequencies. FIG. 2 provides an electric circuit diagram of an NPN implementation of a current mirror 200. The current mirror 200 is substantially the same as the current mirror circuit 100 of FIG. 1, except that it additionally illustrates relevant parasitic components for high operating frequencies. In other words, FIG. 2 illustrates important parasitic devices that may degrade the bandwidth and the linearity of the circuit 100. It is to be understood that parasitic components shown in the present figures and discussed herein are not components deliberately built in a circuit, but, rather, electric circuit diagram representations of inadvertent effects or behavior that may be exhibited by a circuit.

Elements of FIG. 2 having reference numerals shown in FIG. 1 are intended to illustrate the same or analogous elements as those described with respect to FIG. 1, so that, in the interest of brevity, their descriptions are not repeated. This is applicable to other figures of the present disclosure—elements with reference numerals described with reference to one figure may be the same or analogous as elements with the same reference numerals shown in another figure, so that descriptions provided for one figure are applicable to the other figure and don't have to be repeated.

The current mirror 200 may be affected by one of more of a parasitic capacitance 216, a parasitic capacitance 218, a parasitic capacitance 220, a parasitic capacitance 228, and a resistance 224, each of which coupled as shown in FIG. 2.

The parasitic capacitance 216 may represents all routing parasitic capacitances associated with the node 106, parasitic capacitance of 104 input current source loading node 106, as well as collector-substrate capacitance and extrinsic base terminal parasitic capacitors of the transistors Q1 and Q2. Note that the modern SOI process based bipolar transistor collector-substrate capacitor is relatively small and can be treated as being linear. The parasitic capacitance 218 may represent the intrinsic base-emitter forward-bias diffusion capacitance of the transistor Q1. The parasitic capacitance 220 may represent the intrinsic base-emitter forward-bias diffusion capacitance of the transistor Q2 (and may be N times larger than the parasitic capacitance 218 if the emitter area of the transistor Q2 is N times larger than that of the transistor Q1). The parasitic capacitance 228 may represent the intrinsic base-collector junction parasitic capacitance of the transistor Q2. The resistance 224 may represent an output resistance (RO) of the current mirror 100/200.

Inventors of the present disclosure realized that, as can be seen from the analysis of the circuit in FIG. 2, three distinct mechanisms degrading the bandwidth and/or the linearity of the current mirror may be identified for bipolar transistor implementations. One is bandwidth degradation due to the parasitic capacitors. Another one is linearity degradation due to nonlinearity of the intrinsic base-collector junction parasitic capacitance (e.g., the parasitic capacitance 228, shown in FIG. 2). The third one is linearity degradation due to linear parasitic capacitance 216. Similarly, a number of linearity degradation mechanisms may be identified for CMOS transistor implementations of current mirror circuits. One degradation mechanism for the CMOS implementations is bandwidth degradation due to the parasitic capacitors, similar to the bipolar implementations. Another one is linearity degradation due to linear capacitive load on node 106. The third one is linearity degradation due to gate-drain capacitance $C_{GD}$. Inventors of the present disclosure further realized that improving on at least some of these degradation mechanisms could provide an improvement in terms of designing linear broadband current mirrors.

A Current Mirror Arrangement with a Double-Base Current Circulator

In general, different techniques may be implemented to improve on one or more of the problems described above, where some tradeoffs may have to be made, e.g., in trading performance with complexity. Embodiments of the present disclosure aim to address the nonlinearity related to the base-collector junction parasitic capacitance, described above. The nonlinear base-collector junction parasitic capacitance can be quite large due to the large quiescent current at the output of the current mirror, common for broadband designs. The base-collector junction parasitic capacitance may convert the output signal swing to a nonlinear current at the output node and load the diode side of the current mirror, hence degrading the overall linearity, as well as also reducing the current mirror bandwidth due to miller effect. Embodiments of the present disclosure are based on recognition that implementing high-frequency cascoding may provide an improvement with respect to reducing nonlinearity related to the base-collector junction parasitic capacitance.

Figure 3:
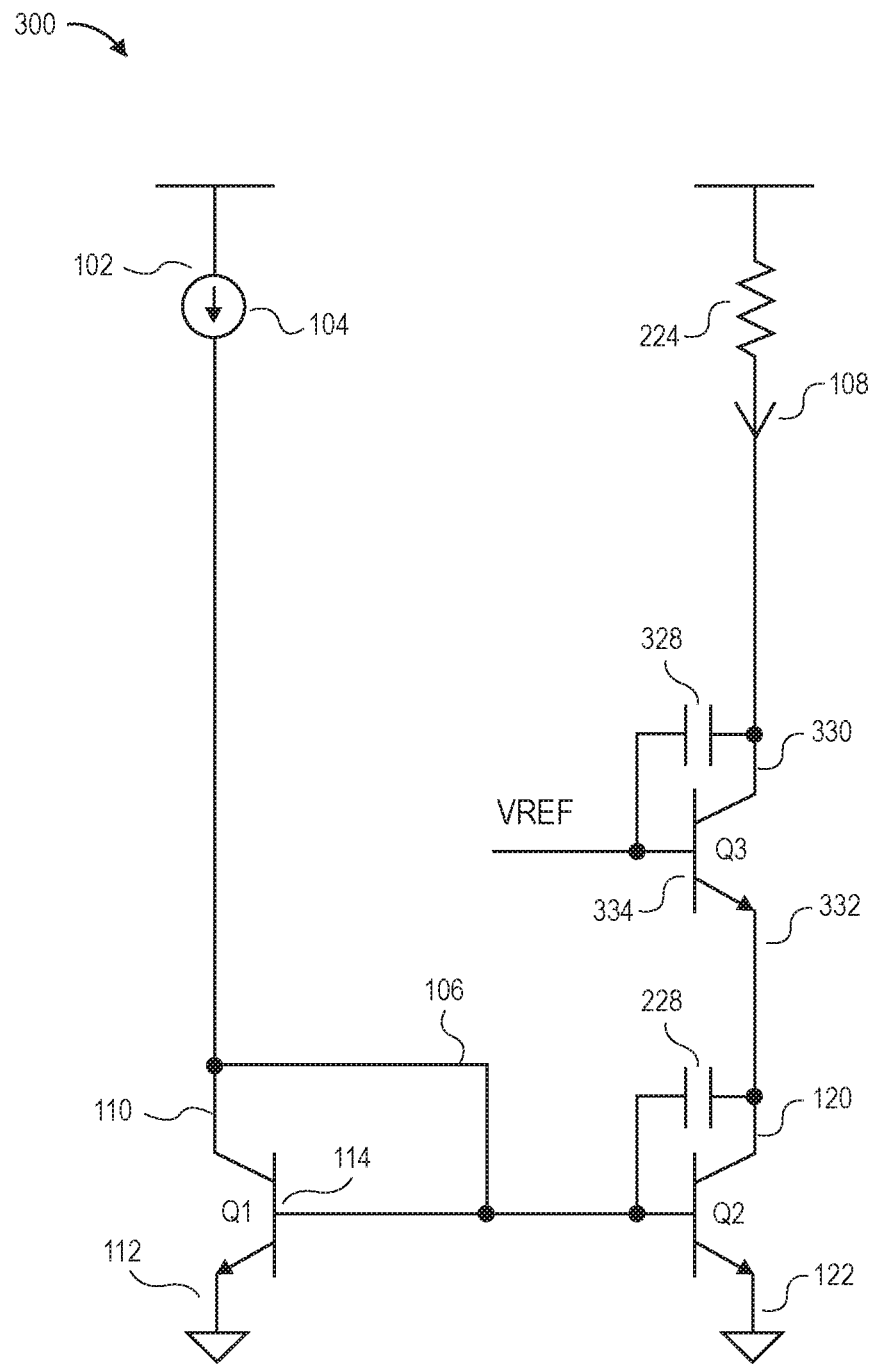
FIG. 3 provides an electric circuit diagram of an NPN implementation of a cascode current mirror.

For high frequency application, cascoding technique is utilized primarily to isolate input side of the circuit from the signal disturbance caused by the large swing at its output. This technique may effectively eliminate the miller effect that is loading the node 106 to degrade the mirror's bandwidth as well as its linearity. An example of a cascoding technique is shown in FIG. 3, providing an electric circuit diagram of an NPN implementation of a cascode current mirror 300. FIG. 3 illustrates a current mirror formed by the transistors Q1 and Q2, similar to that shown in FIG. 1. FIG. 3 further illustrates an intrinsic base-collector junction parasitic capacitance 228 associated with the transistor Q2, as well as the resistance 224, similar to that shown in FIG. 2. Other parasitic capacitances of FIG. 2 are not shown in FIG. 3 because the focus is now on the base-collector junction parasitic capacitance.

As shown in FIG. 3, in addition to the current mirror formed by transistors Q1 and Q2, the cascode current mirror 300 further includes a transistor Q3. Similar to the transistors Q1 and Q2, the transistor Q3 may be an NPN transistor having a collector 330, an emitter 332, and a base 334. The emitter 332 of the transistor Q3 may be coupled to the collector 120 of the transistor Q2. The collector 330 of the transistor Q3 may be coupled to the output resistance 224, or the output current 108. The base 334 of the transistor Q3 may be coupled to a reference voltage VREF. The transistor Q3 may be used to hold the collector node voltage of the transistor Q2 substantially constant, or, phrased differently, to make the equivalent impedance seen from the transistor Q2 collector terminal to be equal to 1/gm3 rather than that of the output resistance 224. FIG. 3 further illustrates a parasitic capacitance 328 associated with the transistor Q3, which is the intrinsic base-collector junction capacitance, similar to the capacitance 228. Thus, the cascode current mirror 300 may include two intrinsic base-collector junction capacitances associated with, respectively, the transistors Q2 and Q3 shown in FIG. 3. In the cascode current mirror 300, the nonlinear current through the intrinsic base-collector junction capacitance of the transistor Q1 is not shown since the signal swing across the intrinsic base-collector junction capacitance of this transistor may be negligible.

Although the cascode current mirror 300 may provide an improvement in terms of mitigating the miller effect, it does not improve the nonlinear current injected to the output current by the nonlinear reverse-biased capacitance 328 of the transistor Q3. This nonlinear current can limit the achievable linearity, especially for applications where high-frequency signals may need to be generated (e.g., to serve as drive signals for an analog-to-digital converter (ADC)), when the capacitances 228 and 328 and the output swing are large.

To reduce the nonlinear current at the output (due to the intrinsic base-collector junction capacitances), embodiments of the present disclosure propose circulating the nonlinear current.

Figure 4:
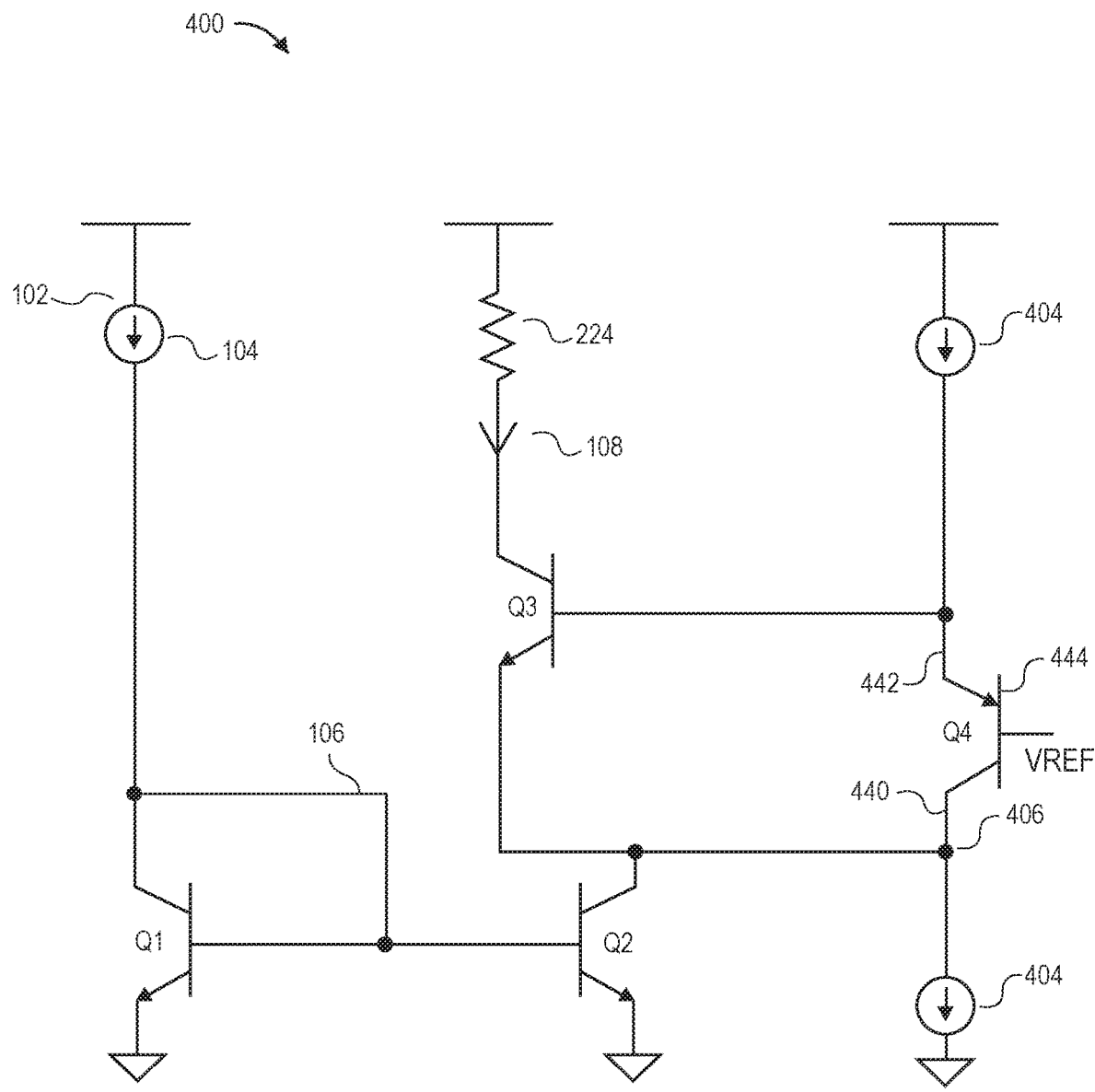
FIG. 4 provides an electric circuit diagram of an NPN implementation of a current mirror arrangement with a current mirror and a conventional current circulator.

The current circulation technique is a technique used to compensate/circulate the cascode transistor base current to cancel it at the transistor collector. A classical implementation is shown in FIG. 4, providing an electric circuit diagram of an NPN implementation of a current mirror arrangement 400 with a current mirror and a conventional current circulator. The current mirror arrangement 400 includes a current mirror formed by the transistors Q1 and Q2, the individual terminals of which transistors are not labeled in FIG. 4 in order to not clutter the drawing. The current circulator may then be formed by the transistor Q3 as shown in FIG. 3, the individual terminals of which transistor are also not labeled in FIG. 4 in order to not clutter the drawing, and a transistor Q4, which may be a PNP transistor having a collector terminal 440, an emitter terminal 442, and a base terminal 444. FIG. 4 further illustrates a node 406, between the collector 440 of the transistor Q4 and the current mirror (namely, between the collector 440 of the transistor Q4 and the collector of the transistor Q2), as well as bias current source 404, which may be used to provide the bias current for the transistor Q4. In the arrangement 400, the base current of the transistor Q3 may circulate through the transistor Q4 to remove itself at the collector of the transistor Q3. The transistors Q4 and Q3 may be used to keep the voltage of the node 406 substantially constant to achieve the desired cascoding to eliminate the miller effect.

Figure 5:
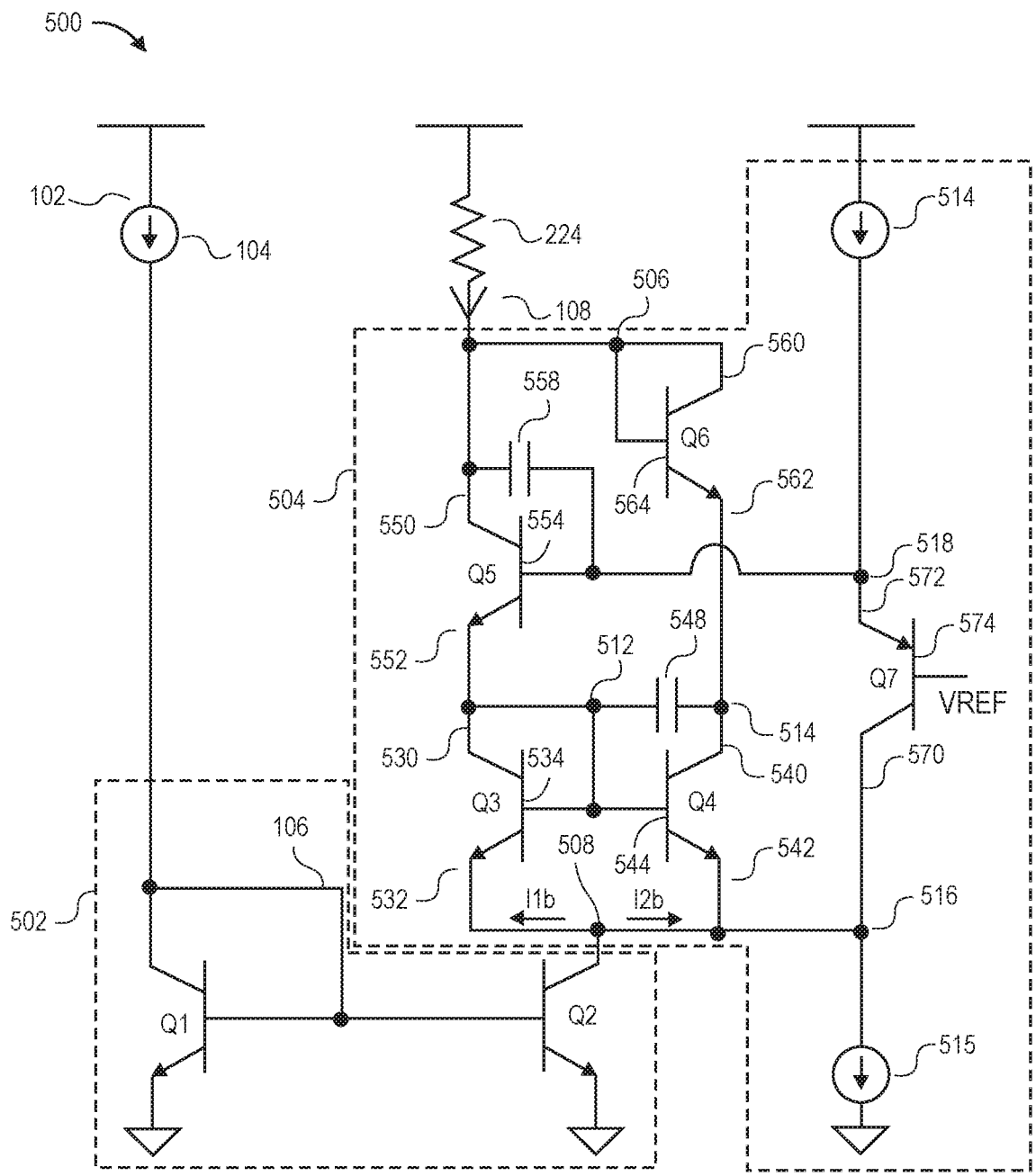
FIG. 5 provides an electric circuit diagram of an NPN implementation of a current mirror arrangement with a current mirror and a double-base current circulator, according to some embodiments of the disclosure.

Inventors of the present disclosure realized that the current mirror arrangement 400 may not be the most optimal at high operating frequencies because of the speed limitation of the slow PNP feedback transistor (i.e., the transistor Q4) since, generally speaking, the switching speeds of PNP bipolar transistors are significantly lower compared to those of NPN bipolar transistors. FIG. 5 provides an electric circuit diagram of an NPN implementation of a current mirror arrangement 500 with a current mirror 502 and a double-base current circulator 504, according to some embodiments of the disclosure, which may improve on this issue.

The current mirror 502 of the current mirror arrangement 500 may be formed by the transistors Q1 and Q2, the individual terminals of which transistors are not labeled in FIG. 5 in order to not clutter the drawing. Similar to a conventional current mirror shown in FIG. 1, the current mirror 502 is configured to receive an input current 102 ($I_{IN}$)

and generate a mirrored current (IM) at the output 508 of the current mirror 502, where IM=K*$I_{IN}$, where K is a positive number greater than 0 (which value may, but does not have to be, an integer), indicative of a ratio of an area of the emitter of the transistor Q2 to an area of the emitter of the transistor Q1.

The current circulator 504 is coupled to the current mirror 502 and is configured to convey the mirrored current IM to provide the mirrored current to an output node 506 of the arrangement. The current circulator 504 is a double-base current circulator and includes a first branch and a second branch. The first branch of the current circulator 504 includes a cascode of a transistor Q3 and a transistor Q5. The second branch of the current circulator 504 includes a transistor Q4 and may, optionally, also include a transistor Q6 as shown in FIG. 5. The first branch is configured to receive a first branch current (I1b), where I1b=m*IM, where m is a positive number less than 1. The second branch is configured to receive a second branch current (I2b), where I2b=(1−m)*IM. Thus, the mirrored current at the output node 508 may be split between a portion (m) going to the first branch and the rest (1−m) going to the second branch, where the ratio of an area of the emitter of the transistor Q4 to an area of the emitter of the transistor Q3 is substantially equal to m/(1−m). For example, if the area of the emitter of the transistor Q4 is substantially equal to the area of the emitter of the transistor Q3, then the current at the output 508 of the current mirror 502 may be split substantially equal between the first and second branches.

The first branch is configured to provide the current I1b to the output node 506. The second branch is configured to provide the I2b to the output node 506. Because both the first branch and the second branch are coupled to the output node 506, the respective currents in these two branches may be combined at the output node 506 to form the output current 108 that is a sum of currents Ib1 and Ib2 (which is equal to IM), thus mirroring the input current $I_{IN}$, which, as described above, may be multiplied by a factor of K, at the output node 506. In the embodiments where K is greater than 0 but less than 1, multiplying the input current 104 by a factor of K means attenuating the input current 104. In the embodiments where K is greater than 1, multiplying the input current 104 by a factor of K means increasing, or gaining, the input current 104.

Because one end of each of the first branch and the second branch is coupled to the current mirror 502 and the other end of each of the first branch and the second branch is coupled to the output node 506, the two branch currents (i.e., I1b and I2b) are in electrical parallel to one another. More specifically, an emitter 532 of the transistor Q3 may be coupled to the output of the current mirror 502 and receive the first branch current I1b. A collector 530 of the transistor Q3 may be coupled to an emitter 552 of the transistor Q5 and a collector 550 of the transistor Q5 may be coupled to the output node 506. An emitter 542 of the transistor Q4 may be coupled to the output of the current mirror 502 and receive the second branch current I2b. A base 534 of the transistor Q3 may be coupled to a base 544 of the transistor Q4, as well as to the collector 530 of the transistor Q3. In some embodiments, a collector 540 of the transistor Q4 may be coupled directly to the output node 506, if the transistor Q6 is not included (not specifically shown in FIG. 5). In other embodiments, namely, if the transistor Q6 is included as shown in FIG. 5, the collector 540 of the transistor Q4 may be coupled to an emitter 562 of the transistor Q6 and a collector 560 of the transistor Q6 may then be coupled to the output node 506. A base 564 of the transistor Q6 may also be coupled to the output node 506 (or, equivalently, to the collector 560 of the transistor Q6). A base 554 of the transistor Q5 may be coupled to an emitter 572 of the transistor Q7, and a collector 570 of the transistor Q7 may be coupled to a node 516. A base terminal 574 of the transistor Q7 may be coupled to a reference voltage VREF. FIG. 5 further illustrates a bias current source 514, which may be coupled to the emitter 572 of the transistor Q7. FIG. 5 further illustrates an optional bias current source 515, which may, in some embodiments, be coupled to the collector 570 of the transistor Q7, e.g., via the node 516. In other embodiments, the collector 570 of the transistor Q7 is not coupled to the bias current source 515.

FIG. 5 further illustrates parasitic capacitances 558 and 548 which are intrinsic base-collector capacitances associated with the transistors Q5 and Q4, respectively. Only the two base-collector capacitances 558, 548 are shown in FIG. 5 because nodes 506 and 514 are two high swing nodes of the current mirror arrangement 500. Hence, the capacitances 558 and 548 are the main contributors of the nonlinear current in the arrangement 500. In some embodiments, the sizes, and, consequently, the base-collector capacitances, of the transistors Q5 and Q4 may be a portion, e.g., a half, of the cascode transistor Q3 shown in FIG. 4.

Embodiments of the present disclosure are based on dividing the output transistor of a current mirror arrangement (i.e., the transistor Q3 in the conventional implementation shown in FIG. 4) into two separate transistors—namely, the transistors Q5 and Q4, shown in FIG. 5, and circulating both of their base currents separately. Each of the parasitic capacitances 558 and 548 are intrinsic devices, meaning that, as other parasitic devices described herein, they are not formed intentionally but are results of forming transistors, in this case—as results of forming the transistors Q5 and Q4, respectively. Said differently, once the transistors Q5 and Q4 are formed, the parasitic capacitances 558 and 548 are present as well. The parasitic capacitance 558 is connected between collector and base terminals of the transistor Q5, so that the current that goes through the parasitic capacitance 558 manifests itself as an extra current originating from the collector 550 and going to the base 554. Similarly, the parasitic capacitance 548 is connected between collector and base terminals of the transistor Q4, so that the current that goes through the parasitic capacitance 548 manifests itself as an extra current originating from the collector 540 and going to the base 544. In order to cancel these currents, the base currents are circulated, hence the current circulator is referred to as "base current circulator." The term "double" (as in the "double-base current circulator") is because the base currents of two transistors, Q5 and Q4, are circulated separately.

As described above, the specific configuration of the current mirror arrangement 500 is such that the current at the output 508 of the current mirror 502 is conveyed to the output node 506 substantially in its entirety, while the parasitic nonlinear currents that are originated from the capacitances 558 and 548 are the ones that may be circulated to be removed at the output node 506. In particular, a first loop may include a sequence of the transistor Q5, the transistor Q7, and parallel branches of the first branch (i.e., a sequence of transistors Q3 and Q5) and the second branch (i.e., a sequence of transistors Q4 and Q6, if Q6 is used; otherwise only the transistor Q4). On the other hand, a second loop may include a sequence of the transistor Q4 and the transistor Q5. Thus, the current mirror arrangement 500 may form two separate loops to circulate the nonlinear currents caused by the parasitic capacitances 558 and 548.

The current through the parasitic capacitance 558 may circulate through the transistor Q7 and then through the first and second parallel branches (i.e., though a path of the transistors Q3 and Q5, and through a parallel path of the transistors Q4 and Q6). On the other hand, the current through the parasitic capacitance 548 may circulate through the transistor Q5. Note that the node 516 may be a high impedance node while looking from the 512 where the nonlinear current due to the parasitic capacitance 558 is injected.

In ideal conditions, meaning the beta of the transistor Q7 may be considered infinite, the emitter current (and hence its collector current) of the transistor Q7 may be equal to the bias current from the bias current source 514, shown in FIG. 5. This current may be sunk to the ground without interfering current from the current mirror 502 using the bias current source 515, also shown in FIG. 5. Thus, the bias current source 514 may be used to bias the transistor Q7 and as such, may be seen as used for the circulator topology and not for the current mirror (which is made of Q1 and Q2) of the current mirror arrangement 500. In the embodiments where the bias current source 515 shown in FIG. 5 is not implemented, then this collector current (i.e., for the collector 570 of the transistor Q7) may be supplied by the current from the current mirror 502. Now, the collector current of the transistor Q7 may change when its emitter current changes. Hence, the transistor Q7 may circulate the current arriving at node 518 from the transistor Q5. This current may be dominated by the parasitic capacitance 558 at high frequencies. Hence, the transistor Q7 may circulate the current from the parasitic capacitance 558 only. As shown in FIG. 5, in some embodiments, the transistor Q7 may be a PNP transistor (in contrast to all other transistors shown in FIG. 5 being NPN transistors). The circulated currents may then be: a first current I1 in the first (slow) loop, dominated by the nonlinear current of the parasitic nonlinear capacitance 558; and a second current I2 in the second (fast) loop, dominated by the nonlinear current of the parasitic nonlinear capacitance 548.

The configuration of the current mirror arrangement 500 may reduce the circulating signal load on the slow circulating loop (i.e., the one containing the relatively slow PNP transistor Q7), compared to the implementation shown in FIG. 4. The remaining current may then be circulated through a much faster circulating loop containing the transistor Q5. Since the linear band extension of the proposed divide and conquer method stems from the fact that the slow circulating loop signal is reduced by conveying the remaining signal to an alternate fast loop, the linear bandwidth can be extended further by diverting more and more circulating signal to the fast loop. In some implementations, this can be achieved by diverting more signal to the Q4-Q6 output branch from the Q3-Q5 branch or, equivalently, increasing the mirroring ratio of Q3-Q4 current mirror above unity. This way, it may be possible to reduce the size, or, equivalently, the base-collector capacitance 558, of the transistor Q5 even further to reduce the signal load on the transistor Q7. The trade-off may be that the minimum collector current of the transistor Q5 may need to be high enough to circulate the nonlinear current of the capacitance 548.

As described above, the transistor Q6 is optional, i.e., in some embodiments of the present disclosure, it may be excluded from the current mirror arrangement 500. In some embodiments, the transistor Q6 may be used to make the stress level of the transistor Q4 substantially equal to that of the transistor Q5, which may improve reliability of the arrangement 500. Including the transistor Q6 may, however, increase the parasitic capacitance 548. Therefore, in other embodiments, the transistor Q6 may be omitted, to benefit from the smaller parasitic capacitance 548.

To summarize some aspects of the current mirror arrangement 500 shown in FIG. 5, if all base terminals of the transistors are referred to as "first terminals," all collector terminals of the transistors are referred to as "second terminals," and all emitter terminals of the transistors are referred to as "third terminals," then the following holds. The current from the current mirror 502 of the current mirror arrangement 500 is split between the first and the second branches of the current circulator 504. The first branch includes a cascode of the transistors Q3 and Q5, configured to provide a portion of the current from the current mirror 502 to the output node 506. The second branch includes at least the transistor Q4 (and, optionally, also the transistor Q6), configured to provide the rest of the current from the current mirror 502 to the output node 506. The currents from the two branches are combined at the output node 506 to generate the output current 108. In some embodiments, the first terminal 574 of the transistor Q7 is coupled to a reference voltage VREF and the second terminal 570 of the transistor Q7 is coupled to the output 508 of the current mirror (i.e., the circuit 502) (e.g., by virtue of the second terminal 570 of the transistor Q7 being coupled to the node 516 and the node 516 being coupled to the current mirror output 508). In some embodiments, the third terminal 572 of the transistor Q7 is coupled to the first terminal 554 of the transistor Q5. In some embodiments, the third terminal 572 of Q7 is further coupled to the bias current source 514. In some embodiments, the current circulator 504 forms two loops in which currents are circulated. The first loop includes, or is formed by, a sequence of the transistor Q5, the transistor Q7, and parallel first and second branches. The first loop is configured to circulate a first current I1. The second loop includes, or is formed by, a sequence of the transistor Q4 and the transistor Q5. The second loop is configured to circulate a second current I2. In some further such embodiments, the first loop may further include the parasitic capacitance 558 between the first terminal 554 and the second terminal 550 of the transistor Q5. In some further embodiments, the second loop may further include the parasitic capacitance 548 between the first terminal 544 and the second terminal 540 of the transistor Q4. In some embodiments, the first terminal 534 of the transistor Q3 may be coupled to the first terminal 544 of the transistor Q4 and/or to the second terminal 530 of the transistor Q3. In some embodiments, the second terminal 530 of the transistor Q3 is coupled to the transistor Q5 (e.g., to the third terminal 552 of the transistor Q5), and the third terminal 532 of the transistor Q3 is coupled to the output of the current mirror 502 (i.e., the third terminal 532 of Q3 is configured to receive a portion of the output current IM of the current mirror 502, namely, the first branch current I1*b*). In some embodiments, the second terminal 550 of the transistor Q5 is coupled to the output node 506, and the second terminal 530 of the transistor Q3 is coupled to the transistor Q5 by being coupled to the third terminal 552 of the transistor Q5. In some embodiments, the second terminal 540 of the transistor Q4 is coupled to the output node 506, and the third terminal 542 of the transistor Q4 is coupled to the output of the current mirror 502 (i.e., the third terminal 542 of Q4 is configured to receive a portion of the output current IM of the current mirror 502, namely, the second branch current I2*b*). In some further embodiments, the third terminal 542 of the transistor Q4 may also be coupled to the second terminal 570 of the transistor Q7. In some embodiments, the current mirror arrangement 500 includes the transistor Q6, such that the first terminal 564 of the transistor Q6 is coupled to the output node 506, the second terminal 560 of the transistor Q6 is coupled to the output node 506, and the third terminal 562 of the transistor Q6 is coupled to the second terminal 540 of the transistor Q4 (thus, the second branch is configured to provide the I2b to the output node by having the third terminal 562 of the transistor Q6 being coupled to the second terminal 540 of the transistor Q4). In some embodiments, the current mirror 502 includes the transistor Q1 and Q2, where the first terminal 114 of the transistor Q1 is coupled to the transistor Q2 (the first terminal 114 of the transistor Q1 is also coupled to the second terminal 110 of the transistor Q1), the second terminal 110 of the transistor Q1 is coupled to the input current 104 ($I_{IN}$), and the second terminal 120 of the transistor Q2 is coupled to each of the first branch and the second branch of the current circulator 504. In some further embodiments, each of the third terminal 112 of the transistor Q1 and the third terminal 122 of the transistor Q2 is coupled to a ground potential (the ground potential indicated in FIG. 5 with respective triangles at the bottom of the circuit diagram).

To summarize the various currents mentioned above, I1a and I1b are current originating from current mirror 502. It is desirable that their sum is substantially equal to $K*I_{IN}$. On the other hand, I1 and I2 are two circulating currents that may be generated by the high swing on output node 506 and the parasitic base-collector capacitances 558 and 548. If not circulated, these nonlinear currents will add on top of $K*I_{IN}$ and make the overall output current 108 nonlinear.

Figure 6:
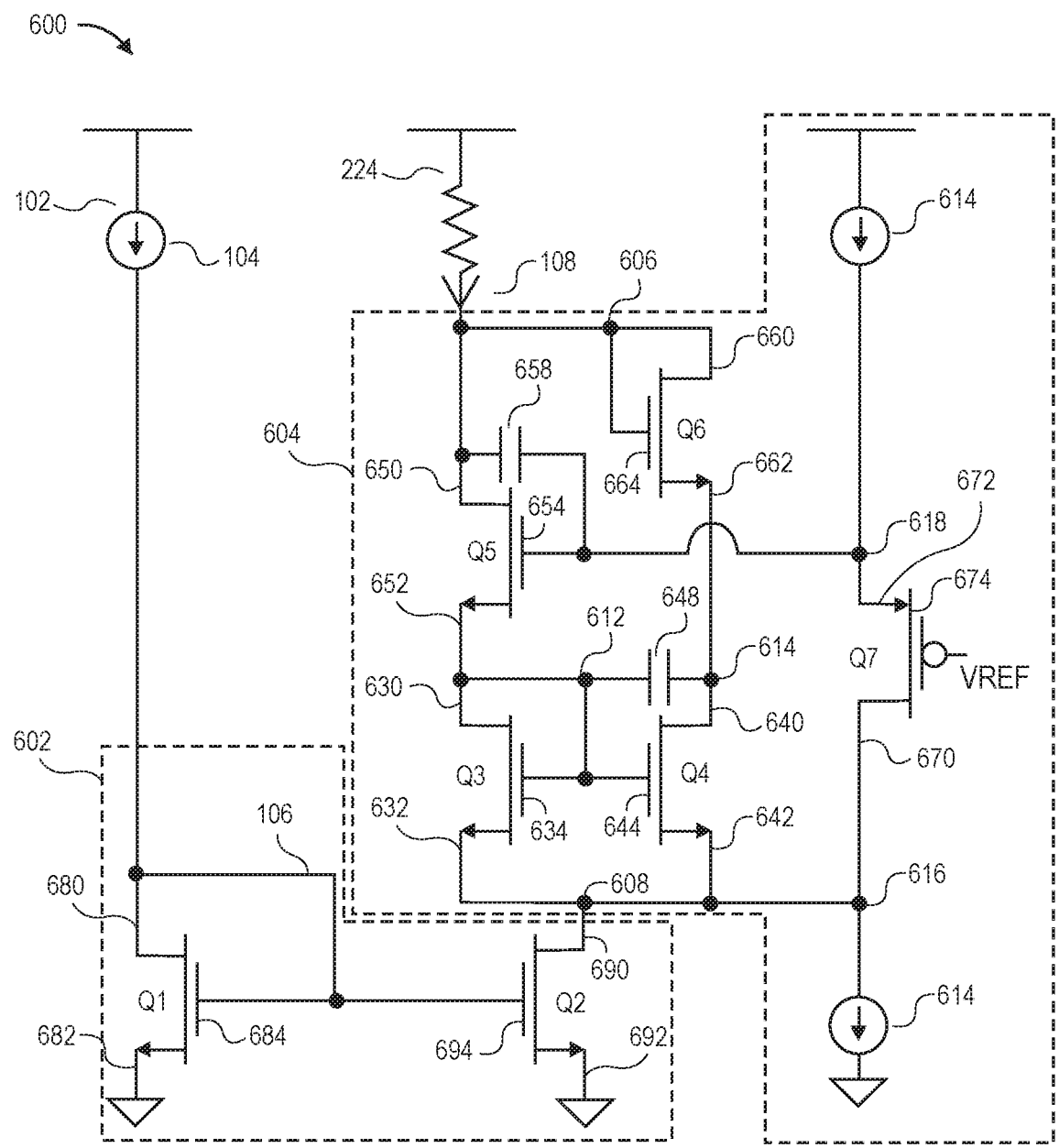
FIG. 6 provides an electric circuit diagram of an NMOS complementary metal-oxide-semiconductor (CMOS) implementation of a current mirror arrangement with a current mirror and a double-base current circulator, according to some embodiments of the disclosure.

While the descriptions provided above refer to the bipolar implementation of the transistors, in other embodiments, a current mirror arrangement may include transistors implemented in CMOS. In particular, FIG. 6 provides an electric circuit diagram of a CMOS implementation of a current mirror arrangement 600 with a current mirror 602 and a double-base current circulator 604, according to some embodiments of the disclosure where transistors Q1-Q6 may be implemented as N-type MOS (NMOS) transistors and the transistor Q7 may be implemented as a P-type MOS (PMOS) transistors. The current mirror arrangement 600 is substantially analogous to the current mirror arrangement 500 except that each NPN transistor of the current mirror arrangement 500 (i.e., transistors Q1-Q6) is replaced with an NMOS transistor in the current mirror arrangement 600, and that the PNP transistor of the current mirror arrangement 500 (i.e., the transistor Q7) is replaced with a PMOS transistor. In such a configuration, the descriptions provided with reference to FIG. 5 are applicable except that the "first terminals" or "base terminals" of the bipolar transistors become "gate terminals" for the CMOS transistors, the "second terminals" or "collector terminals" of the bipolar transistors become "drain terminals" for the CMOS transistors, and the "third terminals" or "emitter terminals" of the bipolar transistors become "source terminals" for the CMOS transistors. The reference numerals 5xx of FIG. 5 are replaced with reference numerals 6xx in FIG. 6, and the reference numerals indicating the transistor terminals of the transistors Q1 and Q2 which are not specifically shown in FIG. 5 but are referred to (i.e., 110, 112, 114, 120, 122, 124) in the description of FIG. 5 are replaced, respectively, with reference numerals 680, 682, 684, 690, 692, 694 in FIG. 6.

In the interests of brevity, a detailed description of FIG. 6 is not provided because it's substantially analogous to that of FIG. 5 except for the changes identified above. Instead, only a summary of the current mirror arrangement 600 is provided. The current mirror 602 is substantially analogous to the current mirror 502 except that the transistors Q1 and Q2 are now NMOS transistors. Similar to the conventional current mirror shown in FIG. 1, the current mirror 602 is configured to receive the input current 102 ($I_{IN}$) and generate a mirrored current (IM) at the output 608 of the current mirror 602, where IM=$K*I_{IN}$, where K is a positive number greater than 0 (which value may, but does not have to be, an integer), indicative of a ratio of the aspect ratio of the transistor Q2 to the aspect ratio of the transistor Q1, where an aspect ratio of a MOS transistor is defined as a channel width divided by a channel length. The current generated by the current mirror 602 of the current mirror arrangement 600 (i.e., the current at the output 608 of the current mirror 602) is split between the first and the second branches of the current circulator 604. The first branch includes a cascode of the NMOS transistors Q3 and Q5, configured to provide a portion of the current from the current mirror 602 to the output node 606. The second branch includes at least the NMOS transistor Q4 (and, optionally, also the NMOS transistor Q6), configured to provide the rest of the current from the current mirror 602 to the output node 606. For example, the mirrored current at the output node 608 may be split between a portion (m) going to the first branch of the current circulator 604 and the rest (1−m) going to the second branch of the current circulator 604, where the ratio of the aspect ratio of the transistor Q4 the aspect ratio of the transistor Q3 may be substantially equal to m/(1−m). The currents from the two branches are combined at the output node 606 to generate the output current 108. In some embodiments, the first terminal 674 of the PMOS transistor Q7 is coupled to a reference voltage VREF and the second terminal 670 of the transistor Q7 is coupled to the output 608 of the current mirror (i.e., the circuit 602) (e.g., by virtue of the second terminal 670 of the transistor Q7 being coupled to the node 616 and the node 616 being coupled to the current mirror output 608). In some embodiments, the third terminal 672 of the transistor Q7 is coupled to the first terminal 654 of the transistor Q5. In some embodiments, the third terminal 672 of Q7 is further coupled to the bias current source 614. In some embodiments, the current circulator 604 forms two loops in which currents are circulated. The first loop includes, or is formed by, a sequence of the transistor Q5, the transistor Q7, and parallel first and second branches. The first loop is configured to circulate a first current I1. The second loop includes, or is formed by, a sequence of the transistor Q4 and the transistor Q5. The second loop is configured to circulate a second current I2, as described above. In some further such embodiments, the first loop may further include the parasitic capacitance 658 between the first terminal 654 and the second terminal 650 of the transistor Q5. In some further embodiments, the second loop may further include the parasitic capacitance 648 between the first terminal 644 and the second terminal 640 of the transistor Q4. In some embodiments, the first terminal 634 of the transistor Q3 may be coupled to the first terminal 644 of the transistor Q4 and/or to the second terminal 630 of the transistor Q3. In some embodiments, the second terminal 630 of the transistor Q3 is coupled to the transistor Q5 (e.g., to the third terminal 652 of the transistor Q5), and the third terminal 632 of the transistor Q3 is coupled to the output 608 of the current mirror 602 (i.e., the third terminal 632 of Q3 is configured to receive a portion of the output current IM of the current mirror 602, namely, the first branch current I1b). In some embodiments, the second terminal 650 of the transistor Q5 is coupled to the output node 606, and the second terminal 630 of the transistor Q3 is coupled to the transistor Q5 by being coupled to the third terminal 652 of the transistor Q5. In some embodiments, the second terminal 640 of the transistor Q4 is coupled to the output node 606, and the third terminal 642 of the transistor Q4 is coupled to the output 608 of the current mirror 602 (i.e., the third terminal 642 of Q4 is configured to receive a portion of the output current IM of the current mirror 602, namely, the second branch current I2b). In some further embodiments, the third terminal 642 of the transistor Q4 may also be coupled to the second terminal 670 of the transistor Q7. In some embodiments, the current mirror arrangement 600 may include the transistor Q6, such that the first terminal 664 of the transistor Q6 is coupled to the output node 606, the second terminal 660 of the transistor Q6 is coupled to the output node 606, and the third terminal 662 of the transistor Q6 is coupled to the second terminal 640 of the transistor Q4 (thus, the second branch is configured to provide a current indicative of the I2b to the output node by having the third terminal 662 of the transistor Q6 being coupled to the second terminal 640 of the transistor Q4). In some embodiments, the current mirror 602 includes the transistor Q1 and Q2, where the first terminal 684 of the transistor Q1 is coupled to the transistor Q2 (the first terminal 684 of the transistor Q1 is also coupled to the second terminal 680 of the transistor Q1), the second terminal 680 of the transistor Q1 is coupled to the input current 104 ($I_{IN}$), and the second terminal 690 of the transistor Q2 is coupled to each of the first branch and the second branch of the current circulator 604. In some further embodiments, each of the third terminal 682 of the transistor Q1 and the third terminal 692 of the transistor Q2 is coupled to a ground potential (the ground potential indicated in FIG. 6 with respective triangles at the bottom of the circuit diagram).

Figure 7:
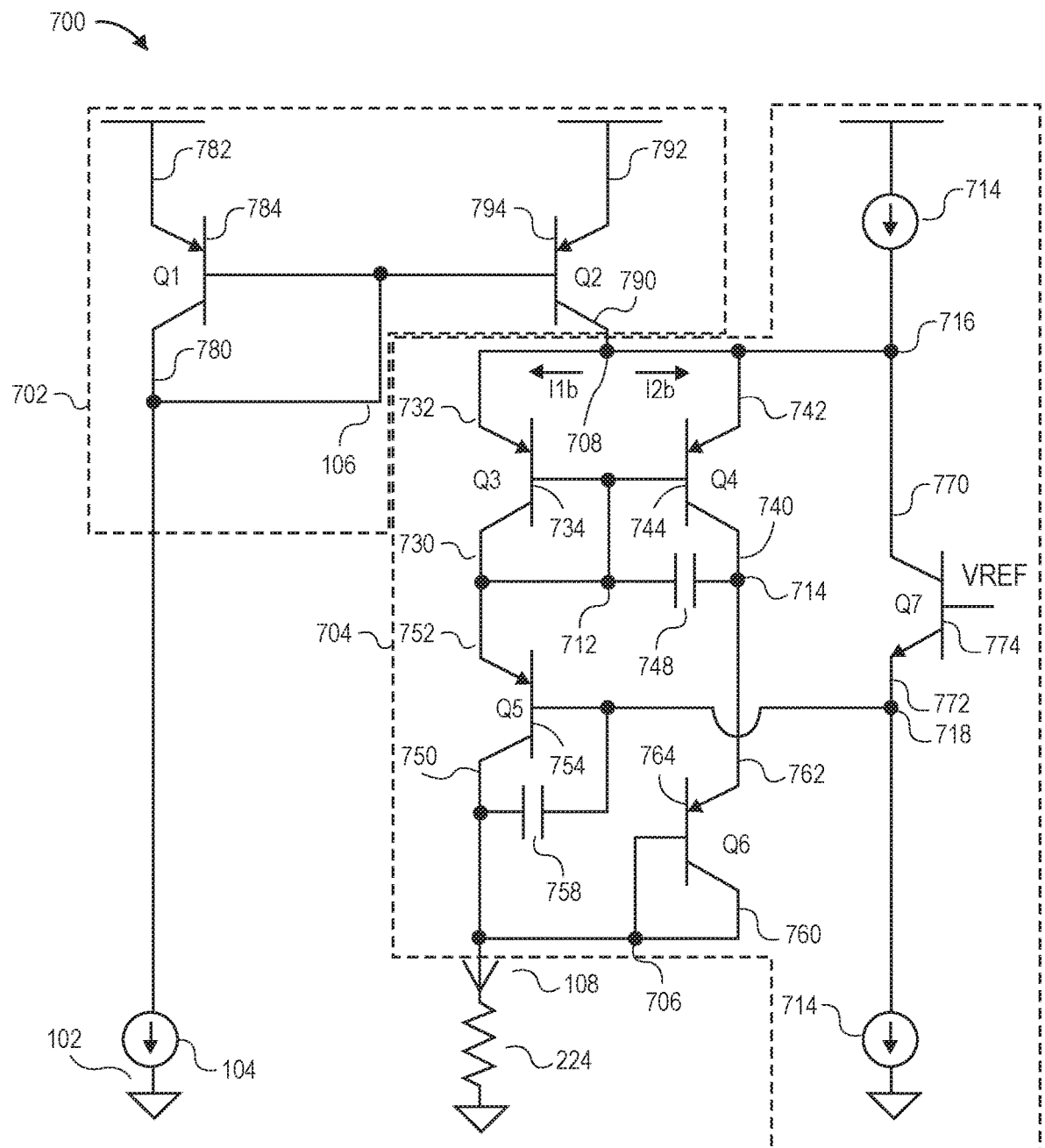
FIG. 7 provides an electric circuit diagram of a PNP implementation of a current mirror arrangement with a current mirror and a double-base current circulator, according to some embodiments of the disclosure.

Further variations to the current mirror arrangements with double-base current circulator are possible. In particular, while the descriptions provided above refer to the NPN and NMOS implementation of the transistors Q1-Q6 of the current mirror arrangements (i.e., with the transistors Q1-Q6 being implemented as N-type transistors) and the PNP and PMOS implementation of the transistor Q7 (i.e., with the transistor Q7 being implemented as a P-type transistor), in other embodiments, the transistors Q1-Q6 described above may be implemented as PNP or PMOS transistors (i.e., as P-type transistors) and the transistor Q7 may be implemented as an NPN or an NMOS transistor (i.e., as an N-type transistor). FIG. 7 provides an electric circuit diagram of a PNP implementation of a current mirror arrangement 700 with a current mirror 702 and a double-base current circulator 704, according to some embodiments of the disclosure where transistors Q1-Q6 may be implemented as PNP transistors and the transistor Q7 may be implemented as an NPN transistor. The current mirror arrangement 700 is substantially analogous to the current mirror arrangement 500 except that each NPN transistor of the current mirror arrangement 500 (i.e., transistors Q1-Q6) is replaced with a PNP transistor in the current mirror arrangement 700, and that the PNP transistor of the current mirror arrangement 500 (i.e., the transistor Q7) is replaced with an NPN transistor. In such a configuration, the descriptions provided with reference to FIG. 5 are applicable except that NPN and PNP transistors are swapped. The designations such as "first/base terminals," "second/collector terminals," and "third/emitter terminals" remain the same. The reference numerals 5xx of FIG. 5 are replaced with reference numerals 7xx in FIG. 7, and the reference numerals indicating the transistor terminals of the transistors Q1 and Q2 which are not specifically shown in FIG. 5 but are referred to (i.e., 110, 112, 114, 120, 122, 124) in the description of FIG. 5 are replaced, respectively, with reference numerals 780, 782, 784, 790, 792, 794 in FIG. 7.

In the interests of brevity, a detailed description of FIG. 7 is not provided because it's substantially analogous to that of FIG. 5 except for the changes identified above. Instead, only a summary of the current mirror arrangement 700 is provided. The current mirror 702 is substantially analogous to the current mirror 502 except that the transistors Q1 and Q2 are now PNP transistors. Similar to the conventional current mirror shown in FIG. 1, the current mirror 702 is configured to receive the input current 102 ($I_{IN}$) and generate a mirrored current (IM) at the output 708 of the current mirror 702, where IM=K*$I_{IN}$, where K is a positive number greater than 0 (which value may, but does not have to be, an integer), indicative of a ratio of an area of the emitter of the transistor Q2 to an area of the emitter of the transistor Q1. The current generated by the current mirror 702 of the current mirror arrangement 700 (i.e., the current at the output 708 of the current mirror 702) is split between the first and the second branches of the current circulator 704. The first branch includes a cascode of the PNP transistors Q3 and Q5, configured to provide a portion of the current from the current mirror 702 to the output node 706. The second branch includes at least the PNP transistor Q4 (and, optionally, also the PNP transistor Q6), configured to provide the rest of the current from the current mirror 702 to the output node 706. For example, the mirrored current at the output node 708 may be split between a portion (m) going to the first branch of the current circulator 704 and the rest (1−m) going to the second branch of the current circulator 704, where the ratio of an area of the emitter of the transistor Q4 to an area of the emitter of the transistor Q3 may be substantially equal to m/(1−m). The currents from the two branches are combined at the output node 706 to generate the output current 108. In some embodiments, the first terminal 774 of the NPN transistor Q7 is coupled to a reference voltage VREF and the second terminal 770 of the transistor Q7 is coupled to the output 708 of the current mirror (i.e., the circuit 702) (e.g., by virtue of the second terminal 770 of the transistor Q7 being coupled to the node 716 and the node 716 being coupled to the current mirror output 708). In some embodiments, the third terminal 772 of the transistor Q7 is coupled to the first terminal 754 of the transistor Q5. In some embodiments, the third terminal 772 of Q7 is further coupled to the bias current source 714. In some embodiments, the current circulator 704 forms two loops in which currents are circulated. The first loop includes, or is formed by, a sequence of the transistor Q5, the transistor Q7, and parallel first and second branches. The first loop is configured to circulate a first current I1. The second loop includes, or is formed by, a sequence of the transistor Q4 and the transistor Q5. The second loop is configured to circulate a second current I2. In some further such embodiments, the first loop may further include the parasitic capacitance 758 between the first terminal 754 and the second terminal 750 of the transistor Q5. In some further embodiments, the second loop may further include the parasitic capacitance 748 between the first terminal 744 and the second terminal 740 of the transistor Q4. In some embodiments, the first terminal 734 of the transistor Q3 may be coupled to the first terminal 744 of the transistor Q4 and/or to the second terminal 730 of the transistor Q3. In some embodiments, the second terminal 730 of the transistor Q3 is coupled to the transistor Q5 (e.g., to the third terminal 752 of the transistor Q5), and the third terminal 732 of the transistor Q3 is coupled to the output 708 of the current mirror 702 (i.e., the third terminal 732 of Q3 is configured to receive a portion of the output current IM of the current mirror 702, namely, the first branch current I1b). In some embodiments, the second terminal 750 of the transistor Q5 is coupled to the output node 706, and the second terminal 730 of the transistor Q3 is coupled to the transistor Q5 by being coupled to the third terminal 752 of the transistor Q5. In some embodiments, the second terminal 740 of the transistor Q4 is coupled to the output node 706, and the third terminal 742 of the transistor Q4 is coupled to the output 708 of the current mirror 702 (i.e., the third terminal 742 of Q4 is configured to receive a portion of the output current IM of the current mirror 702, namely, the second branch current I2b). In some further embodiments, the third terminal 742 of the transistor Q4 may also be coupled to the second terminal 770 of the transistor Q7. In some embodiments, the current mirror arrangement 700 may include the transistor Q6, such that the first terminal 764 of the transistor Q6 is coupled to the output node 706, the second terminal 760 of the transistor Q6 is coupled to the output node 706, and the third terminal 762 of the transistor Q6 is coupled to the second terminal 740 of the transistor Q4 (thus, the second branch is configured to provide a current indicative of the I2b to the output node by having the third terminal 762 of the transistor Q6 being coupled to the second terminal 740 of the transistor Q4). In some embodiments, the current mirror 702 includes the transistor Q1 and Q2, where the first terminal 784 of the transistor Q1 is coupled to the transistor Q2 (the first terminal 784 of the transistor Q1 is also coupled to the second terminal 780 of the transistor Q1), the second terminal 780 of the transistor Q1 is coupled to the input current 104 ($I_{IN}$), and the second terminal 790 of the transistor Q2 is coupled to each of the first branch and the second branch of the current circulator 704. In some further embodiments, each of the third terminal 782 of the transistor Q1 and the third terminal 792 of the transistor Q2 is coupled to a supply potential (the supply potential indicated in FIG. 7 with respective T-symbols at the top of the circuit diagram).

Although not specifically shown in the current figures, in another embodiment, the PNP transistors Q1-Q6 of the current mirror arrangement 700 may be replaced with PMOS transistors, and the NPN transistor Q7 of the current mirror arrangement 700 may be replaced with an NMOS transistor.

Still further variations to the current mirror arrangements with double-base current circulator are possible. For example, in some embodiments, a current mirror arrangement with N-type transistors Q1-Q6 and P-type transistor Q7 (i.e., a current mirror arrangement similar to the current mirror arrangements 500 or 600) may include any combination of NPN and NMOS transistors as the transistors Q1-Q6 (i.e., any one of the transistors Q1-Q6 may be implemented either as an NPN transistor or as an NMOS transistor) in combination with the transistor Q7 being implemented either as a PNP transistor or as a PMOS transistor. Similarly, in some embodiments, a current mirror arrangement with P-type transistors Q1-Q6 and N-type transistor Q7 (i.e., a current mirror arrangement similar to the current mirror arrangement 700 or the analogous CMOS implementation described above) may include any combination of PNP and PMOS transistors as the transistors Q1-Q6 (i.e., any one of the transistors Q1-Q6 may be implemented either as a PNP transistor or as a PMOS transistor) in combination with the transistor Q7 being implemented either as an NPN transistor or as an NMOS transistor.

Figure 8:
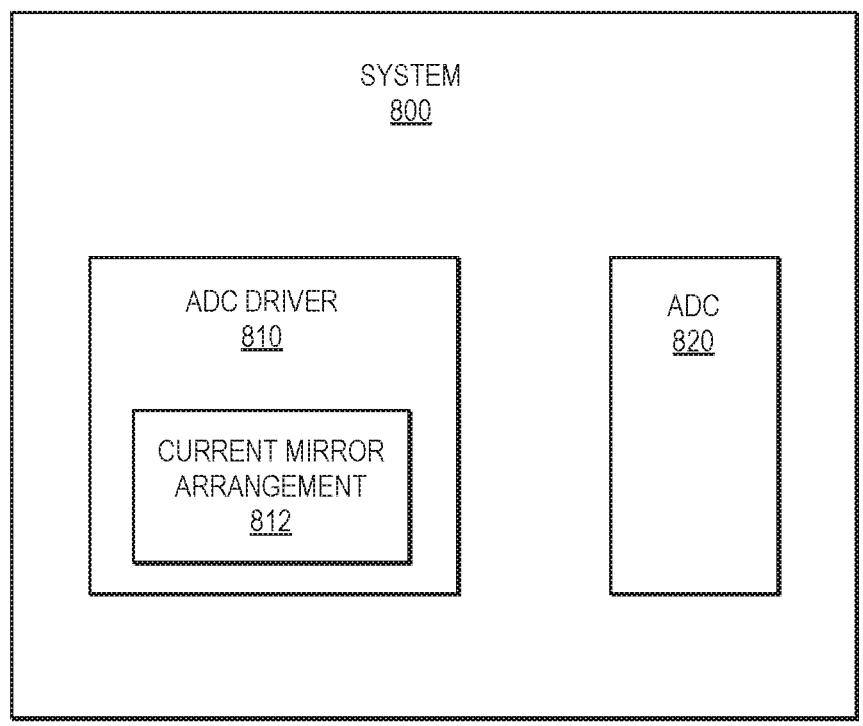
FIG. 8 provides a schematic illustration of a system implementing a current mirror arrangement with a current mirror and a double-base current circulator, according to some embodiments of the disclosure.

Example System with a Current Mirror Arrangement with a Double-Base Current Circulator Various embodiments of a current mirror arrangement with a current mirror and a double-base current circulator as described above may be implemented in any kind of system where current mirroring may be used. Such current mirror arrangements may be particularly useful in systems where current mirrors that have both high linearity and wide signal bandwidth are required. One example of such a system is shown in FIG. 8, providing a schematic illustration of a system 800 implementing a current mirror arrangement 812, according to some embodiments of the disclosure. As shown in FIG. 8, the system 800 may include an ADC driver 810 and an ADC 820. The ADC driver 810 may be used to provide drive signals to drive the ADC 820 so that the ADC 820 can translate analog electrical signals to digital form, e.g., for data processing purposes. In particular, the ADC driver 810 may include the current mirror arrangement 812 which can be implemented according to any embodiments of current mirror arrangements with a current mirror and a double-base current circulator described above. For example, the current mirror arrangement 812 may be implemented as the current mirror arrangement 500, 600, or 700, or as any further embodiments of these current mirror arrangements, as described above. The ADC driver 810 may then generate drive signals based on the output signal 108 generated by the current mirror arrangement 812 as described above. In various embodiments, the drive signals generated by the ADC driver 810 may be used to drive a single or dual differential input of the ADC 820.

In various embodiments, the drive signal generated by the ADC driver 810 may realize/implement functions such as buffering, amplitude scaling, single-ended-to-differential and differential-to-single-ended conversion, common-mode offset adjustment, and filtering. In other words, the ADC driver 810 may act as a signal conditioning element in a data conversion stage and may be a key factor in enabling the ADC 820 to achieve its desired performance. The ADC 820 may be any type of ADC, such as a successive approximation register (SAR) converter, a pipeline converter, a flash converter, or a sigma-delta converter.

While embodiments of a current mirror arrangement with a double-base current circulator are described above with references to the example implementation shown in FIG. 8, a person skilled in the art will realize that the various teachings described above are applicable to a large variety of other systems. In some scenarios, various embodiments of a current mirror arrangement with a double-base current circulator as described herein can be used in automotive systems, safety-critical industrial applications, medical systems, scientific instrumentation, wireless and wired communications, radar, industrial process control, audio and video equipment, current sensing, instrumentation (which can be highly precise), and other digital-processing-based systems. In other scenarios, various embodiments of a current mirror arrangement with a double-base current circulator as described herein can be used in the industrial markets that include process control systems that help drive productivity, energy efficiency, and reliability. In yet further scenarios, various embodiments of a current mirror arrangement with a double-base current circulator may be used in consumer applications.

In one example embodiment, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

In another example embodiment, the electrical circuits of the present figures may be implemented as stand-alone modules (e.g., a device with associated components and circuitry configured to perform a specific application or function) or implemented as plug-in modules into application specific hardware of electronic devices. Note that particular embodiments of the present disclosure related to a current mirror arrangement with a double-base current circulator may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the functionalities of a current mirror arrangement with a double-base current circulator, proposed herein, may be implemented in one or more silicon cores in Application Specific Integrated Circuits (ASICs), Field Programmable Gate Arrays (FPGAs), and other semiconductor chips.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the present figures may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the present figures and its teachings are readily scalable and can accommodate a large number of components, as well as more complicated or sophisticated arrangements and configurations. Accordingly, the examples provided should not limit the scope or inhibit the broad teachings of the electrical circuits as potentially applied to a myriad of other architectures.

Select Examples

The following paragraphs provide examples of various ones of the embodiments disclosed herein.

Example 1 provides a current mirror arrangement that includes a current mirror and a current circulator. The current mirror includes a first circuit (e.g., a combination of Q1 and Q2, shown in FIGS. 5-7) configured to receive an input current ($I_{IN}$) and generate a mirrored current (IM), where $IM=K*I_{IN}$, where K is a positive number greater than 0 (which value may, but does not have to be, an integer). The current circulator is coupled to the first circuit and configured to convey the mirrored current to provide the mirrored current to an output node. The current circulator includes a first branch configured to receive a first branch current (I1b), where I1b=m*IM1, where m is a positive number less than 1. The current circulator further includes a second branch configured to receive a second branch current (I2b), where I2b=(1−m)*IM1. The first branch includes a cascode of a transistor Q3 and a transistor Q5 configured to provide the I1b to an output node. The second branch includes a transistor Q4 configured to provide the I2b to the output node.

Example 2 provides the current mirror arrangement according to example 1, further including a transistor Q7 (which may be considered to be a part of the current circulator), where a first terminal of the transistor Q7 is coupled to a reference voltage, and a second terminal of the transistor Q7 is coupled to an output of the first circuit.

Example 3 provides the current mirror arrangement according to example 2, where a third terminal of the transistor Q7 is coupled to a first terminal of the transistor Q5.

Example 4 provides the current mirror arrangement according to example 3, where the third terminal of Q7 is further coupled to a bias current (i.e., the third terminal of Q7 is configured to receive a bias current which may be used for the circulator topology). Such a bias current may be used to bias Q7 and as such, may be seen as used for the circulator topology and not for the current mirror (which is made of Q1 and Q2).

Example 5 provides the current mirror arrangement according to any one of examples 2-4, where the current circulator forms two loops in which currents are circulated. A first of these two loops includes, or is formed by, a sequence of the transistor Q5, the transistor Q7, and parallel branches of the first branch and the second branch. The first loop is configured to circulate a first current I1. A second of these two loops includes, or is formed by, a sequence of the transistor Q4 and the transistor Q5. The second loop is configured to circulate a second current I2.

Example 6 provides the current mirror arrangement according to example 5, where the first loop further includes a parasitic capacitance between the first and second terminals of the transistor Q5, and the second loop further includes a parasitic capacitance between the first and second terminals of the transistor Q4.

Example 7 provides the current mirror arrangement according to any one of examples 2-6, where the transistor Q7 is a P-type transistor (e.g., a PMOS or a PNP transistor), and each of the transistor Q3, the transistor Q4, and the transistor Q5 is an N-type transistor (e.g., an NMOS or an NPN transistor).

Example 8 provides the current mirror arrangement according to any one of the preceding examples, where a first terminal of the transistor Q3 is coupled to a first terminal of the transistor Q4 and/or to a second terminal of the transistor Q3.

Example 9 provides the current mirror arrangement according to any one of the preceding examples, where a second terminal of the transistor Q3 is coupled to the transistor Q5, and a third terminal of the transistor Q3 is coupled to an output of the first circuit (i.e., the third terminal of Q3 is configured to receive a portion of the output current IM of the first circuit, namely, the first branch current Ib1).

Example 10 provides the current mirror arrangement according to any one of the preceding examples, where a second terminal of the transistor Q5 is coupled to the output node, and the second terminal of the transistor Q3 is coupled to the transistor Q5 by being coupled to a third terminal of the transistor Q5.

Example 11 provides the current mirror arrangement according to any one of the preceding examples, where a second terminal of the transistor Q4 is coupled to the output node, and a third terminal of the transistor Q4 is coupled to an output of the first circuit (i.e., the third terminal of Q4 is configured to receive a portion of the output current IM1 of the first circuit, namely, the second branch current Ib2).

In further examples, the third terminal of the transistor Q4 may also be coupled to the second terminal of the transistor Q7.

Example 12 provides the current mirror arrangement according to any one of the preceding examples, further including a transistor Q6, where a first terminal of the transistor Q6 is coupled to the output node, a second terminal of the transistor Q6 is coupled to the output node, and a third terminal of the transistor Q6 is coupled to the second terminal of the transistor Q4 (thus, the second branch is configured to provide the I2b to the output node by having the third terminal of the transistor Q6 being coupled to the second terminal of the transistor Q4).

Example 13 provides the current mirror arrangement according to any one of the preceding examples, where the first circuit includes a transistor Q1 and a transistor Q2, a first terminal of the transistor Q1 is coupled to the transistor Q2 (the first terminal of the transistor Q1 is also coupled to the second terminal of the transistor Q1), a second terminal of the transistor Q1 is coupled to the input current IIN, and a second terminal of the transistor Q2 is coupled to each of the first branch and the second branch of the current circulator.

Example 14 provides the current mirror arrangement according to example 13, where each of a third terminal of the transistor Q1 and a third terminal of the transistor Q2 is coupled to a ground potential.

Example 15 provides the current mirror arrangement according to any one of the preceding examples, where a current from the first branch is combined with a current from the second branch at the output node.

Example 16 provides a current mirror arrangement that includes a current mirror and a current circulator. The current mirror is configured to receive an input current ($I_{IN}$) and generate a mirrored current (IM) based on the input current, where IM=K*$I_{IN}$, where K is a positive number greater than 0 (which value may, but does not have to be, an integer). The current circulator includes an input coupled to an output of the current mirror (e.g., coupled to the output 508/608/708 described herein), an output (e.g., the output 506/606/706 described herein) coupled to an output of the current mirror arrangement, a first branch, having a first end coupled to the input of the current circulator to receive a first portion of the mirrored current (e.g., configured to receive a first branch current (I1b), where I1b=m*IM1, where m is a positive number less than 1), and a second branch, having a first end coupled to the input of the current circulator to receive a second portion of the mirrored current (e.g., configured to receive a second branch current (I2b), where I2b=(1−m)*IM1). Each of the first branch and the second branch has a second end coupled to the output of the current circulator.

Example 17 provides the current mirror arrangement according to example 16, where the first branch includes a sequence of a transistor Q3 and a transistor Q5 coupled between the input of the current circulator and the output of the current circulator, and the second branch includes a transistor Q4 coupled between the input of the current circulator and the output of the current circulator.

Example 18 provides the current mirror arrangement according to example 17, where each of the transistor Q3, the transistor Q4, and the transistor Q5 includes a first terminal, a second terminal, and a third terminal, the second terminal of the transistor Q5 is coupled to the output of the current circulator, the third terminal of the transistor Q5 is coupled to the second terminal of the transistor Q3, the third terminal of the transistor Q3 is coupled to the output of the current mirror, the first terminal of the transistor Q3 is coupled to the second terminal of the transistor Q3, and the first terminal of the transistor Q3 is coupled to the first terminal of the transistor Q4.

Example 19 provides an ADC system that includes an ADC configured to perform analog-to-digital conversion, and further includes an ADC driver configured to provide a drive signal to the ADC to enable the ADC to perform the analog-to-digital conversion. The ADC driver includes a current mirror arrangement configured to generate a current signal. This current signal is further used to generate the drive signal for the ADC. The current mirror arrangement includes a current mirror and a current circulator coupled to an output of the current mirror and configured to generate the current signal based on a signal provided at the output of the current mirror. The current circulator includes a first loop for circulating a first current and a second loop, the second loop being different from the first loop, for circulating a second current, where the first current and the second current are based on the signal provided at the output of the current mirror and there the current signal is based on the first current and the second current.

Example 20 provides the ADC system according to example 19, where the first loop includes a plurality of transistors of a first type of two types of transistors and a further transistor of a second type of the two types of transistors, the second loop includes one or more transistors of the first type of the two types of transistors and no transistors of the second type, and the two types of transistors are N-type transistors (e.g., NMOS or NPN transistors) and P-type transistors (e.g., PMOS or PNP transistors).

Example 21 provides the ADC system according to claim 19 or 20, where the current mirror arrangement is the current mirror arrangement according to any one of the preceding examples.

The invention claimed is:

1. A current mirror arrangement, comprising:
a first circuit configured to receive an input current ($I_{IN}$) and generate a mirrored current (IM), where IM=K*$I_{IN}$, where K is a positive number greater than 0;
a first branch configured to receive a first branch current (I1b), where I1b=m*IM, where m is a positive number less than 1; and
a second branch configured to receive a second branch current (I2b), where I2b=(1−m)*IM,
wherein:
the first branch includes a cascode of a transistor Q3 and a transistor Q5 configured to provide the I1b to an output node,
the second branch includes a transistor Q4 configured to provide the I2b to the output node.

2. The current mirror arrangement according to claim 1, further comprising a transistor Q7, wherein:

a first terminal of the transistor Q7 is coupled to a reference voltage, and
a second terminal of the transistor Q7 is coupled to an output of the first circuit.

3. The current mirror arrangement according to claim 2, wherein a third terminal of the transistor Q7 is coupled to a first terminal of the transistor Q5.

4. The current mirror arrangement according to claim 3, wherein the third terminal of Q7 is further coupled to a bias current.

5. The current mirror arrangement according to claim 4, wherein:
a first loop of the transistor Q5, the transistor Q7, and parallel branches of the first branch and the second branch is configured to circulate a first current I1, and
a second loop of the transistor Q4 and the transistor Q5, is configured to circulate a second current I2.

6. The current mirror arrangement according to claim 5, wherein:
the first loop further includes a parasitic capacitance between the first and second terminals of the transistor Q5, and
the second loop further includes a parasitic capacitance between the first and second terminals of the transistor Q4.

7. The current mirror arrangement according to claim 2, wherein:
the transistor Q7 is a P-type transistor, and
each of the transistor Q3, the transistor Q4, and the transistor Q5 is an N-type transistor.

8. The current mirror arrangement according to claim 1, wherein a first terminal of the transistor Q3 is coupled to a first terminal of the transistor Q4.

9. The current mirror arrangement according to claim 8, wherein:
a second terminal of the transistor Q3 is coupled to the transistor Q5, and
a third terminal of the transistor Q3 is coupled to the first circuit.

10. The current mirror arrangement according to claim 9, wherein:
a second terminal of the transistor Q5 is coupled to the output node, and
the second terminal of the transistor Q3 is coupled to the transistor Q5 by being coupled to a third terminal of the transistor Q5.

11. The current mirror arrangement according to claim 8, wherein:
a second terminal of the transistor Q4 is coupled to the output node, and
a third terminal of the transistor Q4 is coupled to the first circuit.

12. The current mirror arrangement according to claim 11, further comprising a transistor Q6, wherein:
a first terminal of the transistor Q6 is coupled to the output node,
a second terminal of the transistor Q6 is coupled to the output node, and
a third terminal of the transistor Q6 is coupled to the second terminal of the transistor Q4.

13. The current mirror arrangement according to claim 1, wherein:
the first circuit includes a transistor Q1 and a transistor Q2,
a first terminal of the transistor Q1 is coupled to the transistor Q2,
a second terminal of the transistor Q1 is coupled to the input current $I_{IN}$, and
a second terminal of the transistor Q2 is coupled to each of the first branch and the second branch.

14. The current mirror arrangement according to claim 13, wherein each of a third terminal of the transistor Q1 and a third terminal of the transistor Q2 is coupled to a ground potential.

15. The current mirror arrangement according to claim 1, wherein a current from the first branch is combined with a current from the second branch at the output node.

16. A current mirror arrangement, comprising:
a current mirror, configured to receive an input current and generate a mirrored current based on the input current; and
a current circulator, comprising:
an input coupled to an output of the current mirror,
an output,
a first branch, having a first end coupled to the input of the current circulator to receive a first portion of the mirrored current, and
a second branch, having a first end coupled to the input of the current circulator to receive a second portion of the mirrored current,
wherein:
each of the first branch and the second branch has a second end coupled to the output of the current circulator.

17. The current mirror arrangement according to claim 16, wherein:
the first branch includes a sequence of a transistor Q3 and a transistor Q5 coupled between the input of the current circulator and the output of the current circulator, and
the second branch includes a transistor Q4 coupled between the input of the current circulator and the output of the current circulator.

18. The current mirror arrangement according to claim 17, wherein:
each of the transistor Q3, the transistor Q4, and the transistor Q5 includes a first terminal, a second terminal, and a third terminal,
the second terminal of the transistor Q5 is coupled to the output of the current circulator,
the third terminal of the transistor Q5 is coupled to the second terminal of the transistor Q3,
the third terminal of the transistor Q3 is coupled to the output of the current mirror, and
the first terminal of the transistor Q3 is coupled to the first terminal of the transistor Q4.

19. An analog-to-digital converter (ADC) system, comprising:
an ADC configured to perform analog-to-digital conversion; and
an ADC driver configured to provide a drive signal to the ADC to enable the ADC to perform the analog-to-digital conversion,
wherein:
the ADC driver includes a current mirror arrangement configured to generate a current signal, and the drive signal is generated based on the current signal,
the current mirror arrangement includes a current mirror and a current circulator coupled to an output of the current mirror and configured to generate the current signal based on a signal provided at the output of the current mirror, and
the current circulator includes a first loop for circulating a first current and a second loop, different from the first loop, for circulating a second current, where the first current and the second current are based on the signal provided at the output of the current mirror and where the current signal is based on the first current and the second current.

20. The ADC system according to claim 19, wherein:
the first loop includes a plurality of transistors of a first type of two types of transistors and a further transistor of a second type of the two types of transistors,
the second loop includes one or more transistors of the first type of the two types of transistors, and
the two types of transistors are N-type transistors and P-type transistors.

21. The ADC system according to claim 19, wherein:
the current mirror arrangement includes a first branch, comprising a cascode of a transistor Q3 and a transistor Q5, and further includes a second branch, comprising a transistor Q4,
the first loop includes the transistor Q5, and parallel branches of the first branch and the second branch, and
the second loop includes the transistor Q4 and the transistor Q5.

22. The ADC system according to claim 21, wherein the first loop further includes a transistor Q7.

23. The ADC system according to claim 22, wherein:
a first terminal of the transistor Q7 is coupled to a reference voltage, and a second terminal of the transistor Q7 is coupled to the output of the current mirror.

24. The ADC system according to claim 23, wherein a third terminal of the transistor Q7 is coupled to a first terminal of the transistor Q5.

25. The ADC system according to claim 21, wherein:
a first terminal of the transistor Q3 is coupled to a first terminal of the transistor Q4,
a second terminal of the transistor Q3 is coupled to the transistor Q5, and
a third terminal of the transistor Q3 is coupled to the current mirror.

26. The ADC system according to claim 25, wherein:
a second terminal of the transistor Q5 is coupled to an output of the current circulator, and
the second terminal of the transistor Q3 is coupled to the transistor Q5 by being coupled to a third terminal of the transistor Q5.

* * * * *